(12) United States Patent
Uemura

(10) Patent No.: US 8,525,563 B2
(45) Date of Patent: Sep. 3, 2013

(54) SEMICONDUCTOR DEVICE INCLUDING DLL CIRCUIT HAVING COARSE ADJUSTMENT UNIT AND FINE ADJUSTMENT UNIT

(75) Inventor: Yutaka Uemura, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/612,654

(22) Filed: Sep. 12, 2012

(65) Prior Publication Data

US 2013/0076413 A1  Mar. 28, 2013

(30) Foreign Application Priority Data

Sep. 27, 2011 (JP) ................................. 2011-210078

(51) Int. Cl.
*H03L 7/06* (2006.01)
(52) U.S. Cl.
USPC .......................................... 327/156; 327/147
(58) Field of Classification Search
USPC ................................................ 327/147, 156
See application file for complete search history.

(56) References Cited

U.S. PATENT DOCUMENTS

| | | | | |
|---|---|---|---|---|
| 6,956,418 B2 * | 10/2005 | Kwak et al. | ..... | 327/158 |
| 7,088,159 B2 * | 8/2006 | Kwak et al. | ..... | 327/161 |
| 7,388,415 B2 * | 6/2008 | Lee | ..... | 327/158 |
| 7,710,172 B2 | 5/2010 | Kuroki et al. | | |
| 7,839,191 B2 | 11/2010 | Takai | | |
| RE43,775 E * | 10/2012 | Kwak et al. | ..... | 327/161 |
| 8,350,607 B2 * | 1/2013 | Kwak | ..... | 327/158 |
| 2003/0122599 A1 * | 7/2003 | Kim | ..... | 327/161 |
| 2009/0039930 A1 | 2/2009 | Kuroki et al. | | |
| 2009/0289676 A1 | 11/2009 | Takai | | |
| 2013/0099839 A1 * | 4/2013 | Kao et al. | ..... | 327/158 |

FOREIGN PATENT DOCUMENTS

| | | |
|---|---|---|
| JP | 2009-21706 A | 1/2009 |
| JP | 2009-284266 A | 12/2009 |

* cited by examiner

*Primary Examiner* — Adam Houston
(74) *Attorney, Agent, or Firm* — McGinn IP Law Group, PLLC

(57) ABSTRACT

Disclosed herein is a device that includes a coarse adjusting circuit generating first and second clock signals having different phases from each other, and a fine adjusting circuit generating a third clock signal having a phase between a phase of the first clock signal and a phase of the second clock signal. The fine adjusting circuit includes a plurality of first transistors receiving the first clock signal and a plurality of second transistors receiving the second clock signal. The fine adjusting circuit controls the phase of the third clock signal by synthesizing the first clock signal output from selected zero or more of the first transistors based on adjustment codes and the second clock signal output from selected zero or more of the second transistors based on the adjustment codes. The adjustment codes are not a binary system.

20 Claims, 10 Drawing Sheets

| ECLK:OCLK | a | b | c | d | e | f | g | h |
|---|---|---|---|---|---|---|---|---|
| 0:15 | × | × | × | × | × | × | × | × |
| 1:14 | ○ | × | × | × | × | × | × | × |
| 2:13 | × | ○ | × | × | × | × | × | × |
| 3:12 | ○ | ○ | × | × | × | × | × | × |
| 4:11 | × | ○ | ○ | × | × | × | × | × |
| 5:10 | ○ | ○ | ○ | × | × | × | × | × |
| 6:9 | × | ○ | ○ | ○ | × | × | × | × |
| ⋮ | | | | | | | | |
| 14:1 | × | ○ | ○ | ○ | ○ | ○ | ○ | ○ |
| 15:0 | ○ | ○ | ○ | ○ | ○ | ○ | ○ | ○ |

FIG.5

SEMICONDUCTOR DEVICE INCLUDING DLL CIRCUIT HAVING COARSE ADJUSTMENT UNIT AND FINE ADJUSTMENT UNIT

BACKGROUND OF THE INVENTION

1. Field of the Invention

The present invention relates to a semiconductor device, and more particularly relates to a semiconductor device that includes a DLL (Delay Locked Loop) circuit having a coarse adjusting unit and a fine adjusting unit.

2. Description of Related Art

Some of high-speed semiconductor memory devices such as a DRAM (Dynamic Random Access Memory) use a DLL circuit to accurately match an output timing of read data with a clock signal. The DLL circuit generates an internal clock signal accurately phase-controlled and, in some cases, employs a coarse adjusting unit that controls a phase of the internal clock signal at a relatively large adjustment pitch and a fine adjusting unit that controls the phase of the internal clock signal at a relatively small adjustment pitch (see Japanese Patent Application Laid-open Nos. 2009-284266 and 2009-21706).

However, when an adjustment code supplied to the fine adjusting unit is changed, jitters may be caused in the internal clock signal. It is therefore desired that the semiconductor device can decrease jitters caused by changes in the adjustment codes.

SUMMARY

In one embodiment, there is provided a semiconductor device that includes: a coarse adjusting unit generating first and second clock signals having different phases from each other; and a fine adjusting unit generating a third clock signal having a phase between a phase of the first clock signal and a phase of the second clock signal. The fine adjusting unit includes a plurality of first transistors receiving the first clock signal and a plurality of second transistors receiving the second clock signal. The fine adjusting unit controls the phase of the third clock signal in $2^m+n$ steps by synthesizing the first clock signal output from selected zero or more of the first transistors based on adjustment codes and the second clock signal output from selected zero or more of the second transistors based on the adjustment codes, where m is a natural number and n is a natural number equal to or smaller than $2^m$. Smallest one of the first transistors in size enables to change the phase of the third clock signal by one step, and largest one of the first transistors in size enables to change the phase of the third clock signal by smaller than $2^m$ steps. Smallest one of the second transistors in size enables to change the phase of the third clock signal by one step, and largest one of the second transistors in size enables to change the phase of the third clock signal by smaller than $2^m$ steps.

In another embodiment, there is provided a semiconductor device that includes: a coarse adjusting unit generating first and second clock signals having different phases from each other; and a fine adjusting unit generating a third clock signal having a phase between a phase of the first clock signal and a phase of the second clock signal. The fine adjusting unit includes a plurality of first transistors receiving the first clock signal and a plurality of second transistors receiving the second clock signal. The fine adjusting unit controls the phase of the third clock signal in $2^{m+1}$ steps by synthesizing the first clock signal output from selected zero or more of the first transistors based on adjustment codes and the second clock signal output from selected zero or more of the second transistors based on the adjustment codes, where m is a natural number. A number of the first transistors is equal to or more than m+2, and a number of the second transistors is equal to or more than m+2.

In still another embodiment, there is provided a semiconductor device that includes: a coarse adjusting unit generating first and second clock signals having different phases from each other; and a fine adjusting unit generating a third clock signal having a phase between a phase of the first clock signal and a phase of the second clock signal. The fine adjusting unit includes a plurality of first transistors receiving the first clock signal and a plurality of second transistors receiving the second clock signal. The fine adjusting unit controls the phase of the third clock signal in a plurality of steps by synthesizing the first clock signal output from selected zero or more of the first transistors based on adjustment codes and the second clock signal output from selected zero or more of the second transistors based on the adjustment codes. At least two of the first transistors have the same in size and at least two of the second transistors have the same in size.

In still another embodiment, there is provided a semiconductor device that includes: a coarse adjusting circuit including a first input node, a first output node and a second output node, the first input node being configured to be supplied with a first clock signal, the first and second output nodes being configured to be respectively supplied with second and third clock signals of which phases are shifted from a phase of the first clock signal and different from each other; and a fine adjusting circuit including a third output node, a plurality of first delay circuits of which input nodes are coupled in common to the first output node of the coarse adjusting circuit and output nodes are coupled in common to the third output node, and a plurality of second delay circuits of which input nodes are coupled in common to the second output node of the coarse adjusting circuit and output nodes are coupled in common to the third output node, at least two of the first delay circuits being substantially equal in phase shift amount to each other, and at least two of the second delay circuits being substantially equal in phase shift amount to each other.

BRIEF DESCRIPTION OF THE DRAWINGS

FIG. 5 is a table for explaining a relation between selected inverter circuits and obtained phases;

DETAILED DESCRIPTION OF THE EMBODIMENTS

Figure 1:
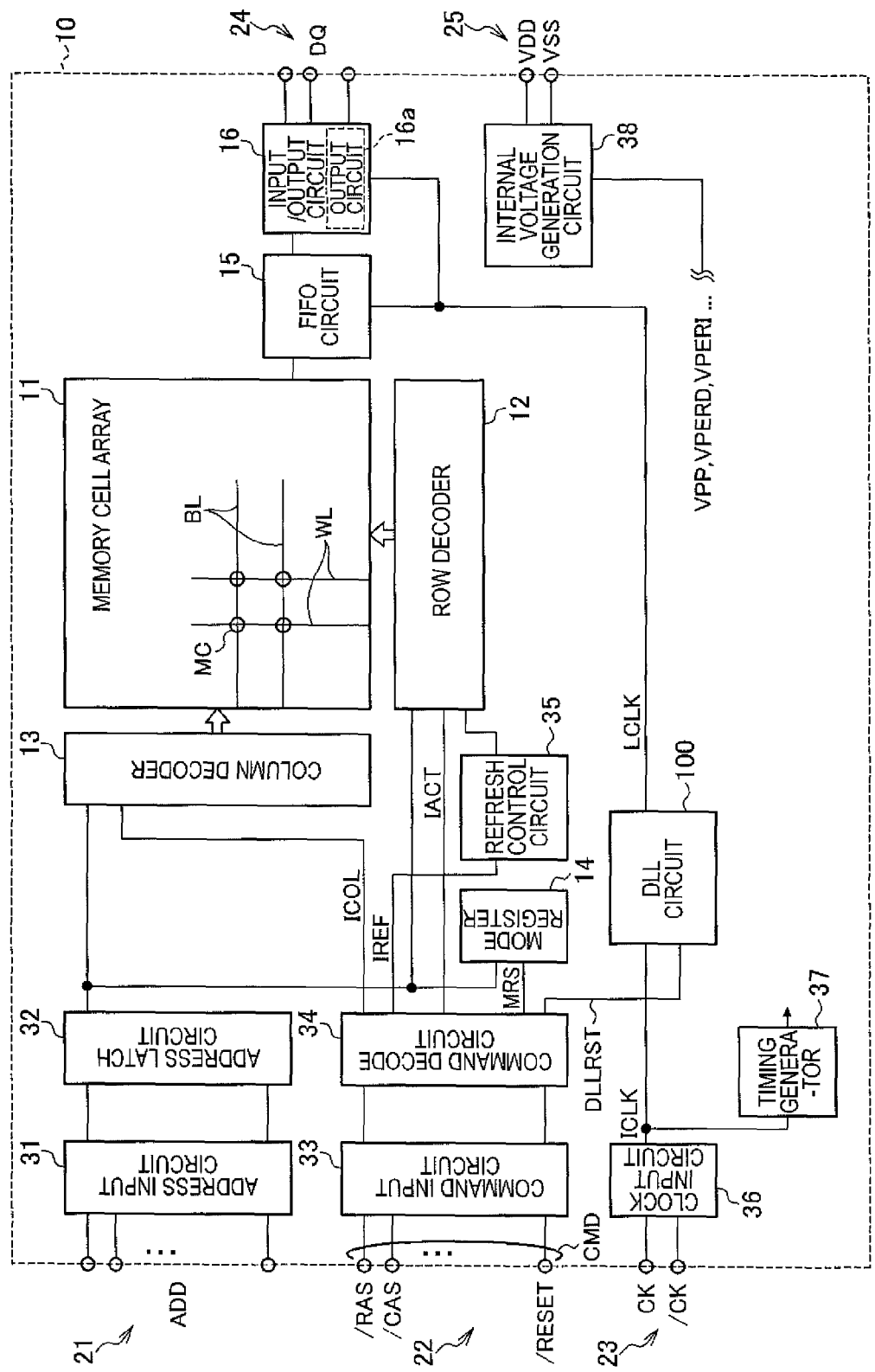
FIG. 1 is a block diagram showing an overall configuration of a semiconductor device according to an embodiment of the present invention.

Referring now to FIG. 1, the semiconductor device 10 according to an embodiment of the present invention is a DRAM integrated in a single semiconductor chip. The semiconductor device 10 includes a memory cell array 11. The memory cell array 11 includes a plurality of word lines WL, a plurality of bit lines BL, and a plurality of memory cells MC arranged at their intersections. The selection of the word line WL is performed by a row decoder 12 and the selection of the bit line BL is performed by a column decoder 13.

As shown in FIG. 1, the semiconductor device 10 employs a plurality of external terminals that include address terminals 21, command terminals 22, clock terminals 23, data terminals 24, and power supply terminals 25.

The address terminals 21 are supplied with an address signal ADD from outside. The address signal ADD supplied to the address terminals 21 is transferred via an address input circuit 31 to an address latch circuit 32 that latches the address signal ADD. The address signal ADD latched in the address latch circuit 32 is supplied to the row decoder 12, the column decoder 13, or a mode register 14. The mode register 14 is a circuit in which parameters indicating an operation mode of the semiconductor device 10 are set.

The command terminals 22 are supplied with a command signal CMD from outside. The command signal CMD is constituted by a plurality of signals such as a row-address strobe signal /RAS, a column-address strobe signal /CAS, and a reset signal /RESET. The slash "/" attached to the head of a signal name indicates an inverted signal of a corresponding signal or indicates that the corresponding signal is a low-active signal. The command signal CMD supplied to the command terminal 22 is transferred via a command input circuit 33 to a command decode circuit 34. The command decode circuit 34 decodes the command signal CMD to generate various internal commands that include an active signal IACT, a column signal ICOL, a refresh signal IREF, a mode register set signal MRS, and a DLL reset signal DLLRST.

The active signal IACT is activated when the command signal CMD indicates a row access (an active command). When the active signal IACT is activated, the address signal ADD latched in the address latch circuit 32 is supplied to the row decoder 12. The word line WL designated by this address signal ADD is selected accordingly.

The column signal ICOL is activated when the command signal CMD indicates a column access (a read command or a write command). When the column signal ICOL is activated, the address signal ADD latched in the address latch circuit 32 is supplied to the column decoder 13. In this manner, the bit line BL designated by this address signal ADD is selected accordingly.

Accordingly, when the active command and the read command are issued in this order and a row address and a column address are supplied in synchronism with these commands, read data is read from a memory cell. MC designated by these row address and column address. Read data DQ is output to outside from the data terminals 24 via an FIFO circuit 15 and an input/output circuit 16. Meanwhile, when the active command and the write command are issued in this order, a row address and a column address are supplied in synchronism with these commands, and then write data DQ is supplied to the data terminals 24, the write data DQ is supplied via the input/output circuit 16 and the FIFO circuit 15 to the memory cell array 11 and written in the memory cell MC designated by these row address and column address. The FIFO circuit 15 and the input/output circuit 16 are operated in synchronism with an internal clock signal LCLK. The internal clock signal LCLK is generated by a DLL circuit 100 to be explained later. Particularly, the input/output circuit 16 includes an output circuit 16a that outputs the read data DQ. The read data DQ is output from the output circuit 16a to the data terminals in synchronism with the internal clock signal LCLK accordingly.

The refresh signal IREF is activated when the command signal CMD indicates a refresh command. When the refresh signal IREF is activated, a row access is made by a refresh control circuit 35 and a predetermined word line WL is selected. In this manner, a plurality of memory cells MC connected to the selected word line WL are refreshed. The selection of the word line WL is made by a refresh counter (not shown) included in the refresh control circuit 35.

The mode register set signal MRS is activated when the command signal CMD indicates a mode register set command. Accordingly, when the mode register set command is issued and a mode signal is supplied from the address terminals 21 in synchronism with this command, a set value of the mode register 14 can be overwritten.

A pair of clock terminals 23 is supplied with external clock signals CK and /CK from outside, respectively. These external clock signals CK and /CK are complementary to each other and then transferred to a clock input circuit 36. The clock input circuit 36 generates an internal clock signal ICLK based on the external clock signals CK and /CK. The internal clock signal ICLK is a basic clock signal within the semiconductor device 10. The internal clock signal ICLK is supplied to a timing generator 37 and thus various internal clock signals are generated. The various internal clock signals generated by the timing generator 37 are supplied to circuit blocks such as the address latch circuit 32 and the command decode circuit 34 and define operation timings of these circuit blocks.

The internal clock signal ICLK is also supplied to the DLL circuit 100. The DLL circuit 100 generates the internal clock signal LCLK based on the internal clock signal ICLK. The internal clock signal LCLK is a clock signal that is phase-controlled. As explained above, the internal clock signal LCLK is supplied to the FIFO circuit 15 and the input/output circuit 16. In this manner, the read data DQ is output in synchronism with the internal clock signal LCLK.

The DLL circuit 100 is reset by the DLL reset signal DLLRST output from the command decode circuit 34. The DLL reset signal DLLRST is activated in response to the reset signal /RESET or a DLL reset command (DLLRST). The reset signal /RESET is activated during an initializing sequence performed when a power supply is switched on. The DLL reset command is issued when the DLL circuit 100 needs to be reset. Accordingly, for example, immediately after a power supply is switched on, the DLL circuit 100 is reset by the DLL reset signal DLLRST.

The power supply terminals 25 are supplied with power supply potentials VDD and VSS. These power supply potentials VDD and VSS are supplied to an internal voltage generation circuit 38. The internal power supply generating circuit 38 generates various internal potentials VPP, VPERD, VPERI, and the like based on the power supply potentials VDD and VSS. The internal potential VPP is mainly used in the row decoder 12, the internal potential VPERD is mainly used in the DLL circuit 100, and the internal potential VPERI is used in many other circuit blocks.

Figure 2:
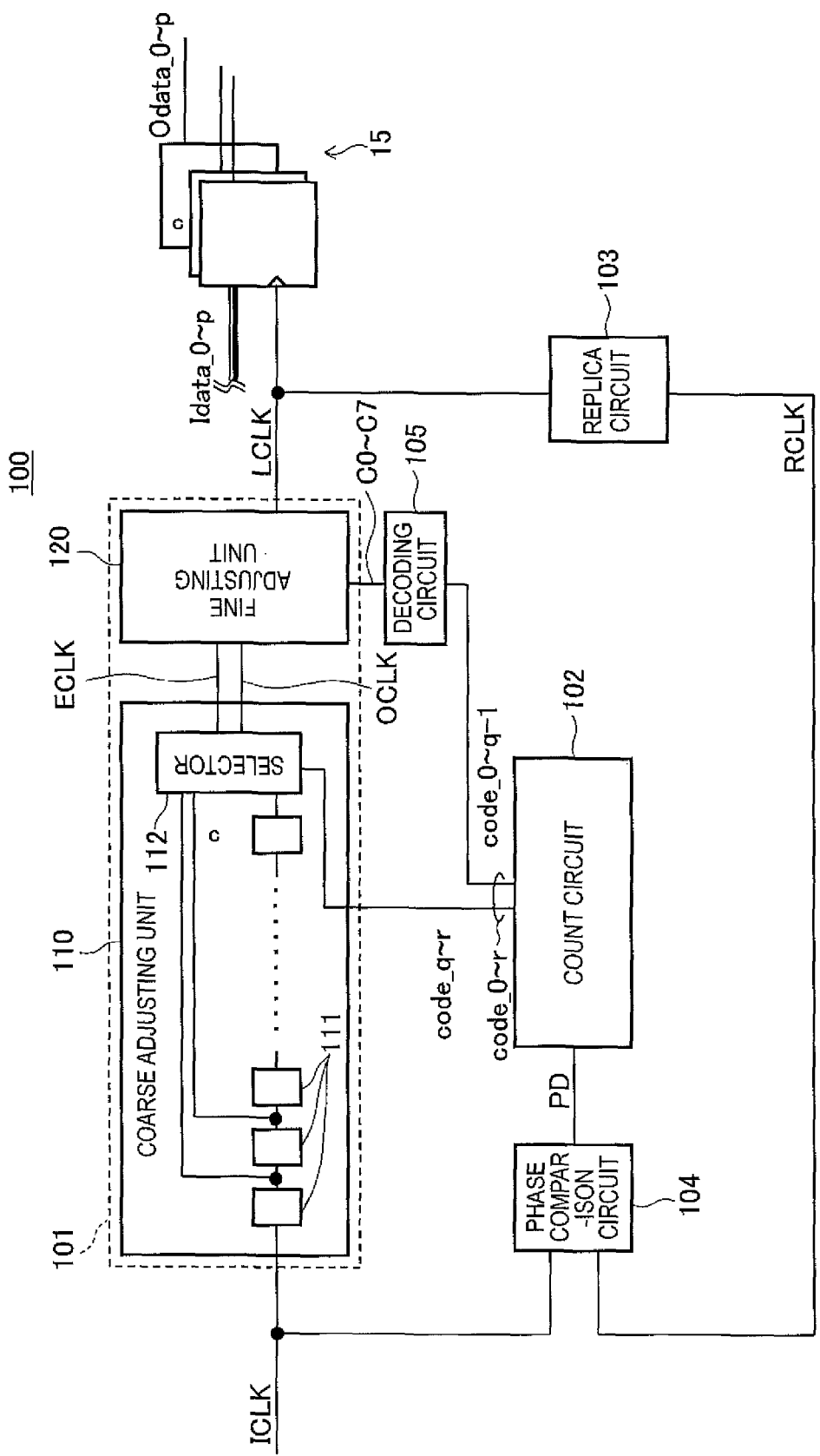
FIG. 2 is a block diagram showing a configuration of the DLL circuit shown in FIG. 1.

Turning to FIG. 2, the DLL circuit 100 includes a delay line 101 that generates the internal clock signal LCLK by delaying the internal clock signal ICLK. The internal clock signal LCLK is used as a timing signal for a plurality of latch circuits included in the FIFO circuit 15, which causes data Idata_0 to Idata_p supplied to the FIFO circuit 15 to be output as data Odata_0 to Odata_p in synchronism with the internal clock signal LCLK, respectively.

The delay line 101 has a configuration in which a coarse adjusting unit (circuit) 110 and a fine adjusting unit (circuit) 120 are series-connected. The coarse adjusting unit 110 is a delay circuit having delay amounts of a relatively large adjustment pitch, and the delay amounts are specified by adjustment codes code_q to code_r. Internal clock signals ECLK and OCLK output from the coarse adjusting unit 110 have phases differing from each other by a minimum adjustment pitch of the coarse adjusting unit 110. The internal clock signals ECLK and OCLK may be also referred to as "first clock signal" and "second clock signal", respectively. On the other hand, the fine adjusting unit 120 is a delay circuit having delay amounts of a relatively small adjustment pitch, and the delay amounts are specified by adjustment codes code_0 to code_q−1. The fine adjusting unit 120 outputs the internal clock signal LCLK. The adjustment codes code_0 to code_r are count values in a binary system supplied from a count circuit 102. The adjustment codes code_q to code_r are upper bits and adjustment codes code_0 to code_q−1 are lower bits.

The internal clock signal LCLK is supplied to the FIFO circuit 15 and the input/output circuit 16 shown in FIG. 1 and is also supplied to a replica circuit 103. The replica circuit 103 generates an internal clock signal RCLK as a replica signal based on the internal clock signal LCLK, and is configured to realize substantially the same delay amount as that realized by the FIFO circuit 15 and the output circuit 16a included in the input/output circuit 16. Because the output circuit 16a outputs the read data DQ synchronously with the internal clock signal LCLK as mentioned above, the internal clock signal RCLK output from the replica circuit 103 is accurately synchronized with the read data DQ. In a DRAM, the read data DQ needs to be accurately synchronized with the external clock signals CK and /CK and, when they have a difference in phases, such a phase difference needs to be detected and corrected. Detection is performed by a phase comparison circuit 104, and a result of the detection is fed back to the count circuit 102 to correct the phase difference.

The phase comparison circuit 104 compares phases of the internal clock signal ICLK with the internal clock signal RCLK and generates a phase determination signal PD based on a comparison result. Because the internal clock signal ICLK has substantially the same phase of the external clock signals CK and /CK and the internal clock signal RCLK has substantially the same phase of the read data DQ in this case, it implies that the phase comparison circuit 104 indirectly compares the phases of the external clock signals CK and /CK with the read data DQ. When a comparison result indicates that the internal cock signal RCLK is delayed from the internal clock signal ICLK, the count of the count circuit 102 is decreased based on the phase determination signal PD, thereby decreasing the delay amount of the delay line 101. Conversely, when the internal clock signal RCLK is ahead of the internal clock signal ICLK, the count of the count circuit 102 is increased based on the phase determination signal PD, thereby increasing the delay amount of the delay line 101. When the phases of the internal clock signal ICLK and the internal clock signal RCLK are matched by periodically repeating this operation, the phases of the read data DQ and the external clock signals CK and /CK are matched accordingly.

As shown in FIG. 2, the coarse adjusting unit 110 includes a plurality of delay elements 111 cascade-connected, and a selector 112. Delay amounts of the delay elements 111 are equal to each other. Each of the delay amounts is defined as the minimum adjustment pitch of the coarse adjusting unit 110. An output signal of each delay element 111 is supplied to the selector 112. The selector 112 selects the two internal clock signals ECLK and OCLK from among a plurality of clock signals output from the delay elements 111, respectively, based on the adjustment codes code_q to code_r. The selected two internal clock signals ECLK and OCLK are supplied to the fine adjusting unit 120. As mentioned above, the internal clock signals ECLK and OCLK have phases differing from each other by the minimum adjustment pitch of the coarse adjusting unit 110. In other words, the internal clock signals ECLK and OCLK correspond to an internal clock signal input to any one of the delay element 111 and an internal clock signal output therefrom, respectively.

The adjustment codes code_0 to code_q−1 output from the count circuit 102 are decoded by a decoding circuit 105 and then supplied to the fine adjusting unit 120. A reason why decoding by the decoding circuit 105 is required is that sizes of a plurality of transistors constituting the fine adjusting unit 120 are different from those corresponding to binary codes, which will be explained below. In the first embodiment, eight bits of adjustment codes C0 to C7 are output from the decoding circuit 105. The adjustment codes C0 to C7 are not signals in the binary form. The number of bits to be activated among the adjustment codes C0 to C7 is not limited to one and a predetermined number (including zero) of bits are activated according to a value before decoding.

Figure 3:
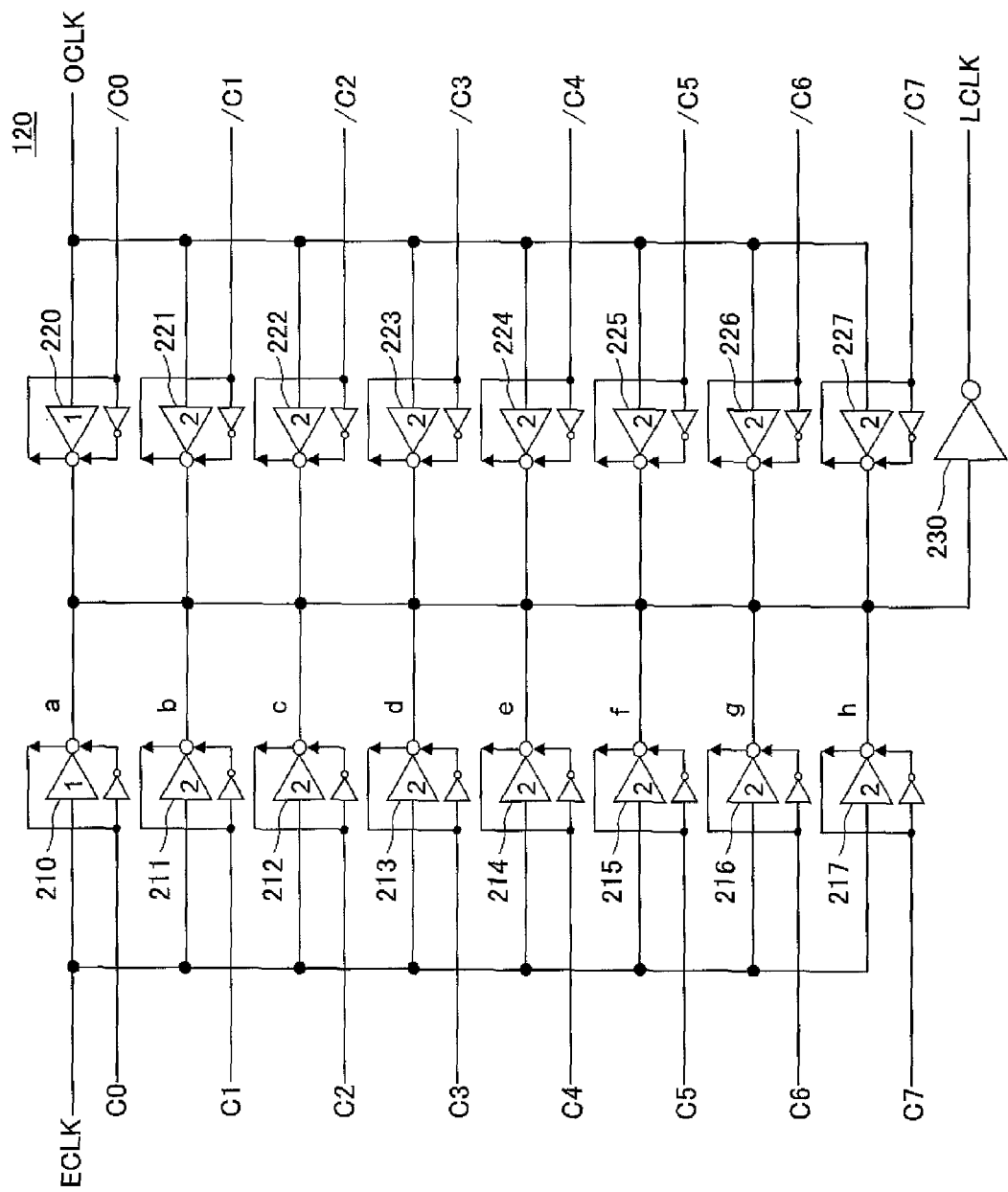
FIG. 3 is a circuit diagram of the fine adjusting unit (circuit) shown in FIG. 2 according to a first embodiment of the present invention.

A circuit diagram of the fine adjusting unit 120 according to the first embodiment will be explained with reference to FIG. 3. FIG. 3 shows an example in which q=4.

As shown in FIG. 3, the fine adjusting unit 120 includes inverter circuits 210 to 217 that receive the internal clock signal ECLK and inverter circuits 220 to 227 that receive the internal clock signal OCLK. Operations of the inverter circuit 210 to 217 are controlled by the adjustment codes C0 to C7 output from the decoding circuit 105 and operations of the inverter circuit 220 to 227 are controlled by adjustment codes /C0 to /C7 which are inverted signals of the adjustment codes C0 to C7, respectively. Therefore, the inverter circuits 210 to 217 and the inverter circuits 220 to 227 corresponding thereto are switched ON mutually exclusively. A clocked inverter, an inverter circuit having a transfer gate connected to an output node, or the like can be used as the inverter circuits capable of being switched ON and OFF.

Output clock signals from the inverter circuits 210 to 217 and 220 to 227 are synthesized and output as the internal clock signal LCLK via an inverter circuit 230. In this way, the internal clock signal LCLK having a phase between the phase of the internal clock signal ECLK and the phase of the internal clock signal OCLK is generated.

Figure 4A:
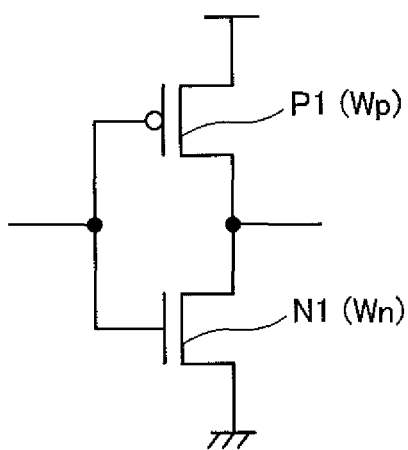
FIG. 4A is a circuit diagram of the inverter circuit shown in FIG. 3 having a drive capability being "1"
Figure 4B:
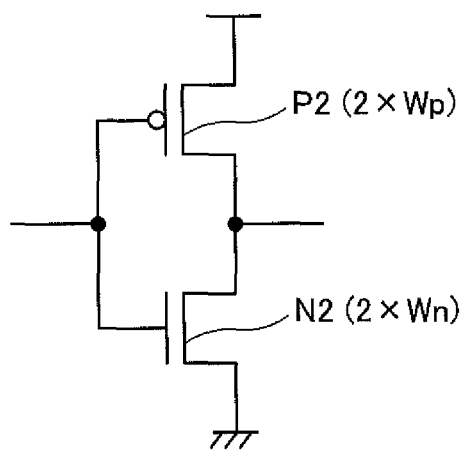
FIG. 4B is a circuit diagram of the inverter circuit shown in FIG. 3 having a drive capability being "2"

A number (1 or 2) shown in a symbol representing the inverter circuit in FIG. 3 denotes a relative size of transistors constituting the inverter circuit. That is, regarding transistors constituting the inverter circuit 210 or 220, a P-channel. MOS transistor P1 has a channel width of Wp and an N-channel MOS transistor N1 has a channel width of Wn as shown in FIG. 4A, and regarding transistors constituting any of the inverter circuits 211 to 217 and 221 to 227, a P-channel MOS transistor P2 has a channel width of 2×Wp and an N-channel MOS transistor N2 has a channel width of 2×Wp as shown in FIG. 4B. Accordingly, drive capabilities of the inverter circuits 211 to 217 and 221 to 227 are twice as large as those of the inverter circuits 210 and 220. Therefore, among the inverter circuits 210 to 217 that receive the internal clock signal ECLK, one has a relative drive capability of "1" and seven have a relative drive capability of "2". Similarly, among the inverter circuits 220 to 227 that receive the internal clock signal OCLK, one has a relative drive capability of "1" and seven have a relative drive capability of "2".

This indicates that the phase of the generated internal clock signal LCLK can be adjusted in 16 steps at an equal interval between the phase of the internal clock signal ECLK and the phase of the internal clock signal OCLK.

Figure 5:
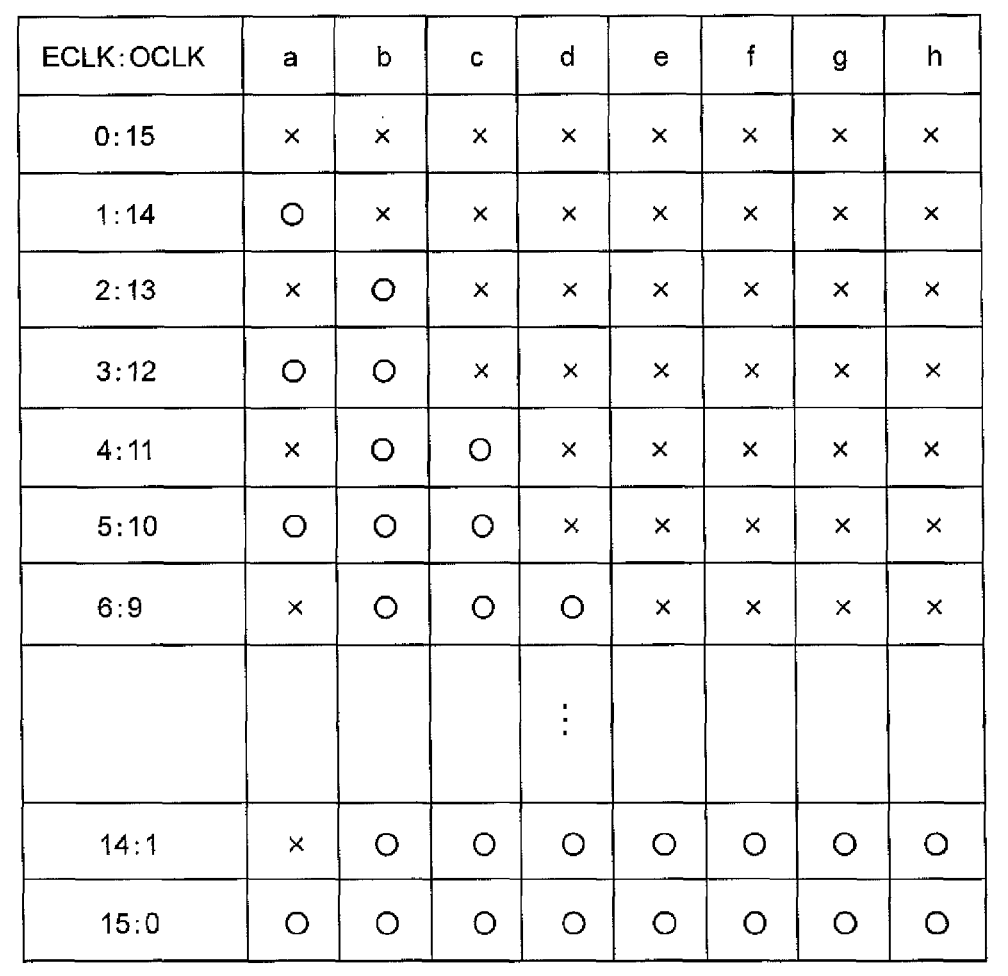

Turning to FIG. 5, that is a table for explaining a relation between selected inverter circuits and obtained phases, in which o (circle) marks in cells corresponding to signs "a" to "h" indicate that corresponding ones of the inverter circuits 210 to 217 are controlled to be ON and corresponding ones of the inverter circuits 220 to 227 are controlled to be OFF, and that x (cross) marks in cells indicate that corresponding ones of the inverter circuits 210 to 217 are controlled to be OFF and corresponding ones of the inverter circuits 220 to 227 are controlled to be ON. As shown in FIG. 5, when the inverter circuits 210 to 217 are all controlled to be OFF and the inverter circuits 220 to 227 are all controlled to be ON (corresponding to a case where the x mark is placed in all the cells), a ratio of a drive capability according to the internal clock signal ECLK to that according to the internal clock signal OCLK is 0:15 and an obtained phase of the internal clock signal LCLK substantially matches with that of the internal clock signal OCLK. Conversely, when the inverter circuits 210 to 217 are all controlled to be ON and the inverter circuits 220 to 227 are all controlled to be OFF (corresponding to a case where the o mark is placed in all the cells), a ratio of a drive capability according to the internal clock signal ECLK to that according to the internal clock signal OCLK is 15:0 and an obtained phase of the internal clock signal LCLK substantially matches with that of the internal clock signal ECLK.

The ratio of the drive capability according to the internal clock signal ECLK to that according to the internal clock signal OCLK can be controlled in 16 steps within a range between 0:15 to 15:0 by selecting the number of inverter circuits to be switched ON and the number of inverter circuits to be switched OFF among the inverter circuits 210 to 217 and 220 to 227.

Figure 6:
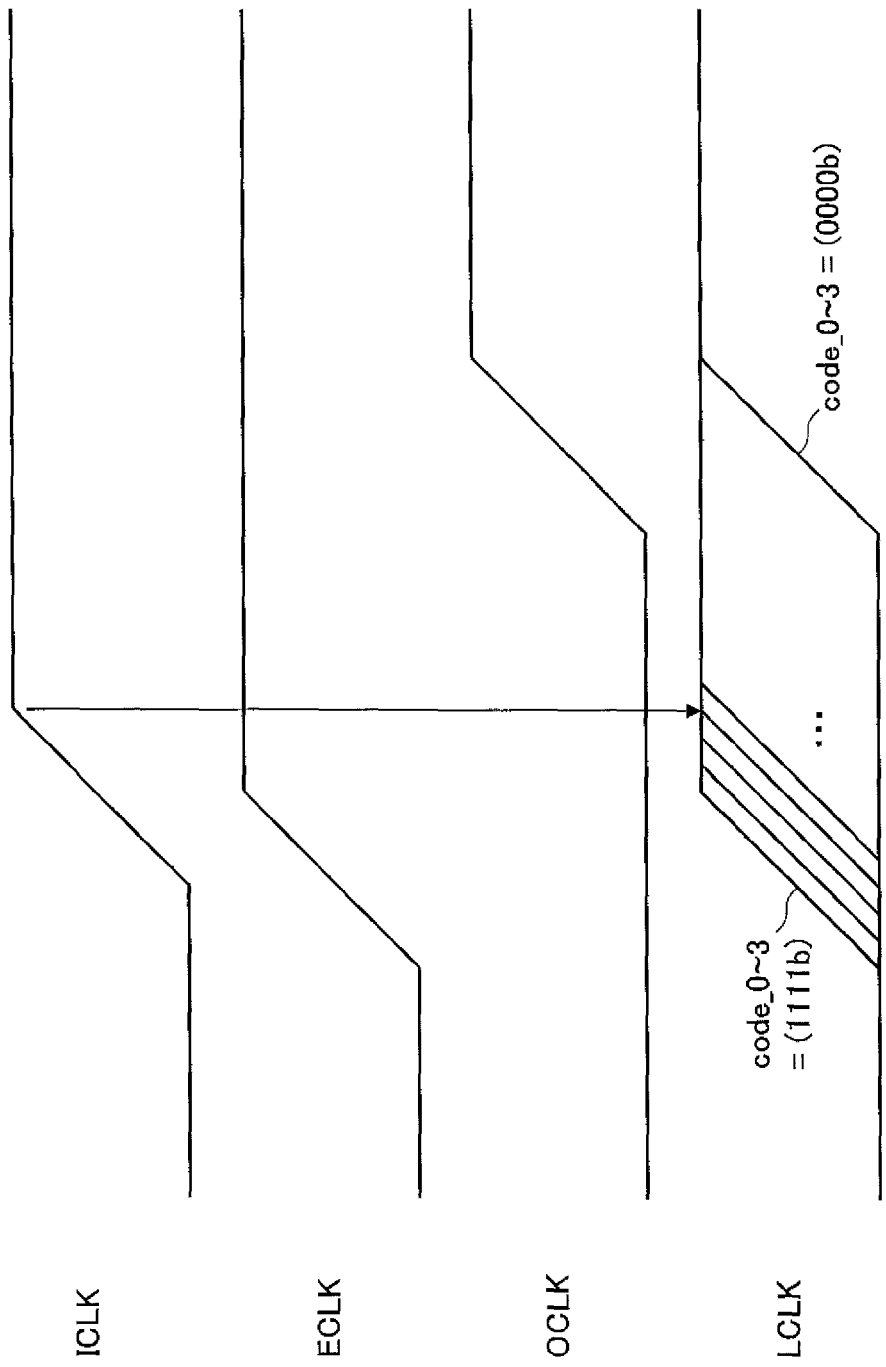
FIG. 6 is a waveform diagram for explaining a function of the fine adjusting unit according to the first embodiment.

As shown in FIG. 6, when the adjustment codes code_0 to code_3 are all at a low level (=0000b), an obtained phase of the internal clock signal LCLK substantially matches with that of the internal clock signal OCLK. This corresponds to the case where the x mark is place in all the cells of "a" to h in the table shown in FIG. 5. When the adjustment codes code_0 to code_3 are all at a high level (=1111b), an obtained phase of the internal clock signal LCLK substantially matches with that of the internal clock signal ECLK. This corresponds to the case where the o mark is placed in all the cells of "a" to h in the table shown in FIG. 5. When the adjustment codes code_0 to code_3 have values therebetween (=0001b to 1110b), an obtained phase of the internal clock signal LCLK is controlled to a predetermined phase between the phase of the internal clock signal OCLK and the phase of the internal clock signal ECLK according to the values of the adjustment codes and matches with the phase of the internal clock signal ICLK.

When the values of the adjustment codes code_0 to code_3 are changed based on the phase determination signal PD, a combination of the inverter circuits to be switched ON and those to be switched OFF among the inverter circuits 210 to 217 and 220 to 27 changes. When all timings of switching from ON to OFF and all timings of switching from OFF to ON completely match, few jitters occur in the internal clock signal LCLK even when the adjustment codes are changed. Practically, it is difficult to completely match these timings and thus jitters are likely to occur.

However, in the first embodiment, when the relative drive capability of the inverter circuits 210 and 220 having the minimum drive capability is "1", the relative drive capability of the inverter circuits 211 to 217 and 221 to 227 having the maximum drive capability is suppressed to "2" and accordingly the jitters caused by changes in the adjustment codes are greatly suppressed. This is because the number of inverter circuits that switch from ON to OFF or from OFF to ON is two at the maximum even when the adjustment codes are changed by one pitch from any value and further the transistor size of each inverter circuit is suppressed, so that capacitances of gates to be driven are low and the timings are less likely to be shifted.

Figure 7:
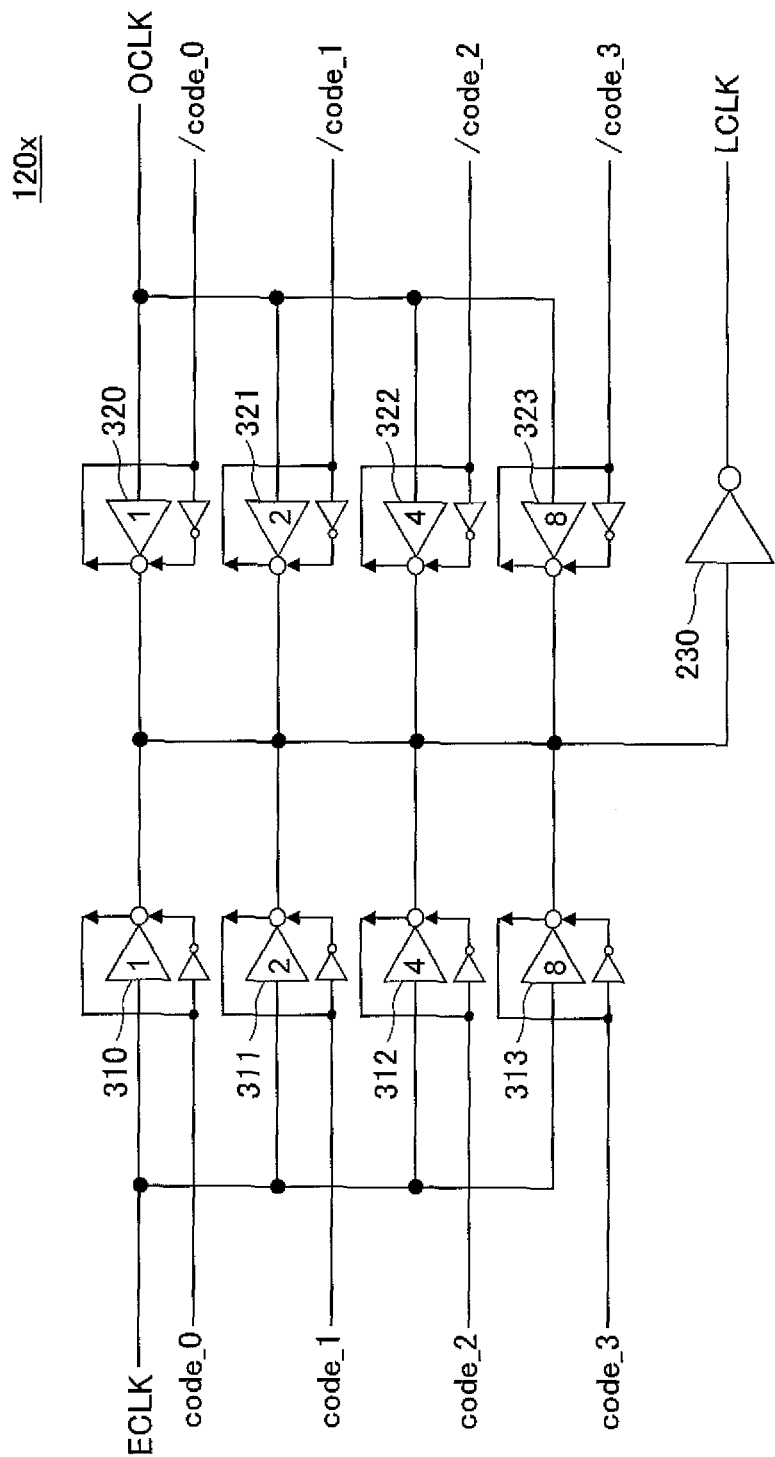
FIG. 7 is a circuit diagram of a fine adjusting unit (circuit) that the inventor has conceived as a prototype in the course of making the present invention.

The fine adjusting unit 120x shown in FIG. 7 that the inventor has conceived as a prototype in the course of making the present invention includes inverter circuits 310 to 313 that receive the internal clock signal ECLK and inverter circuits 320 to 323 that receive the internal clock signal OCLK. Relative drive capabilities of the inverter circuits 310 to 313 are set to "1", "2", "4", and "8", respectively, and are controlled by the adjustment codes code_0 to code_3 undecoded, respectively. Similarly, relative drive capabilities of the inverter circuits 320 to 323 are set to "1", "2", "4", and "8", respectively, and are controlled by inverse signals of the adjustment codes code_0 to code_3 undecoded, respectively.

In this case, the relative drive capabilities of the inverter circuits 313 and 323 that have the highest drive capability are "8" and capacitances of gate electrodes to be driven are larger than those in the first embodiment. Furthermore, when the adjustment codes are changed by one pitch, the number of inverter circuits that switch from ON to OFF or from OFF to ON is four at the maximum, which causes capacitances of gate electrodes to be driven to be larger and the timings to be easily shifted.

On the other hand, in the first embodiment, these problems are solved and the internal clock signal LCLK having a fewer jitters can be generated.

A second embodiment of the present invention will be explained with reference to FIG. 8.

Figure 8:
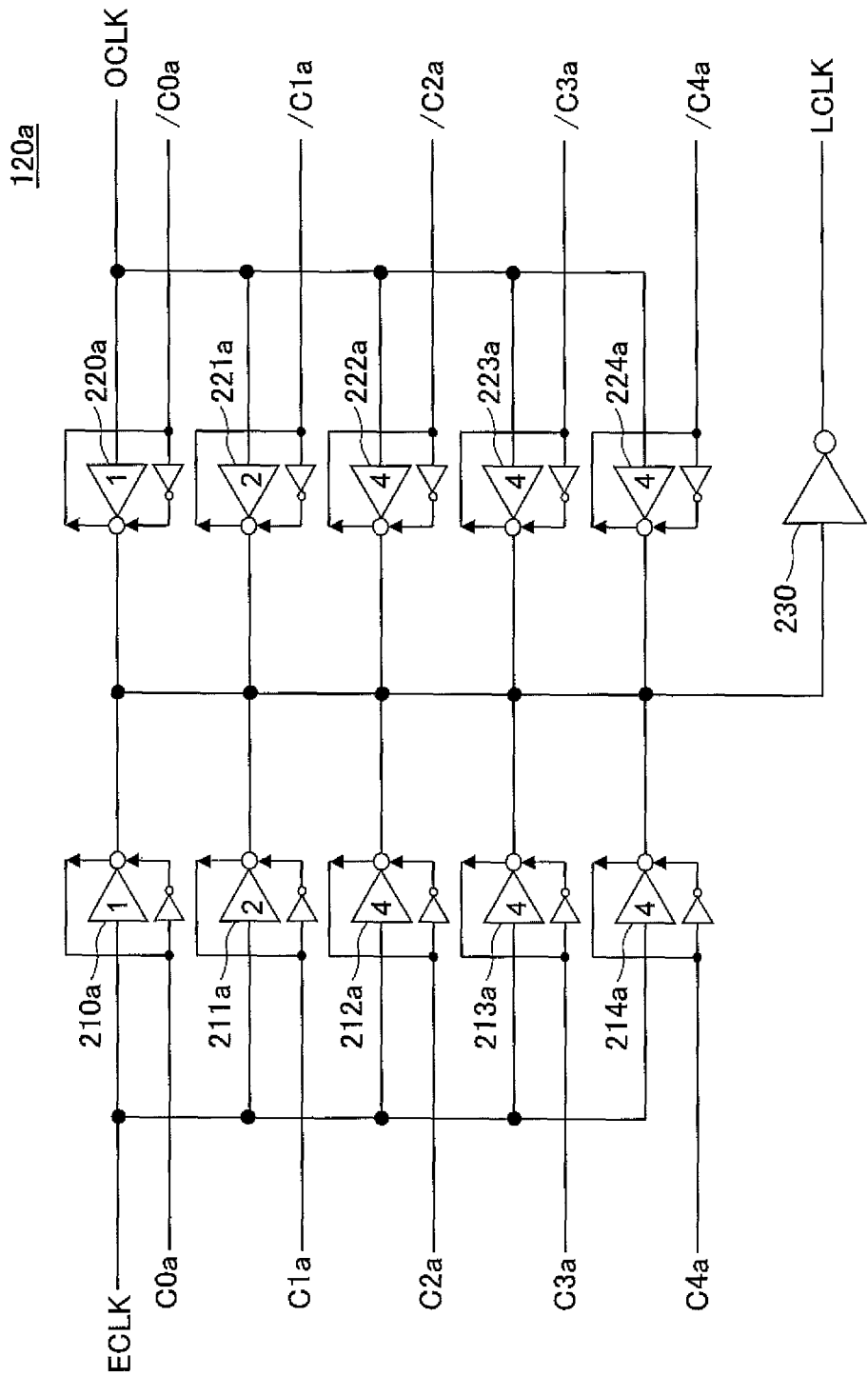
FIG. 8 is a circuit diagram of the fine adjusting unit according to a second embodiment of the present invention.

The fine adjusting unit 120a shown in FIG. 8 includes inverter circuits 210a to 214a that receive the internal clock signal ECLK and inverter circuits 220a to 224a that receive the internal clock signal OCLK. Relative drive capabilities of the inverter circuits 210a to 214a are set to "1", "2", "4", "4", and "4", respectively, and relative drive capabilities of the inverter circuits 220a to 224a are similarly set to "1", "2", "4", "4", and "4", respectively. In this example, the relative drive capabilities of the inverter circuits 214a and 224a having the highest drive capability are suppressed to "4" and the number of inverter circuits that switch from ON to OFF or from OFF to ON is suppressed to three at the maximum. Therefore, the internal clock signal LCLK with fewer jitters than in the comparative example shown in FIG. 7 can be generated.

According to the second embodiment, while the jitters occur slightly more easily than in the first embodiment, the number of bits of adjustment codes C0a to C4a decoded can be suppressed to five and thus the number of required lines can be reduced.

A third embodiment of the present invention will be explained with reference to FIG. 9.

Figure 9:
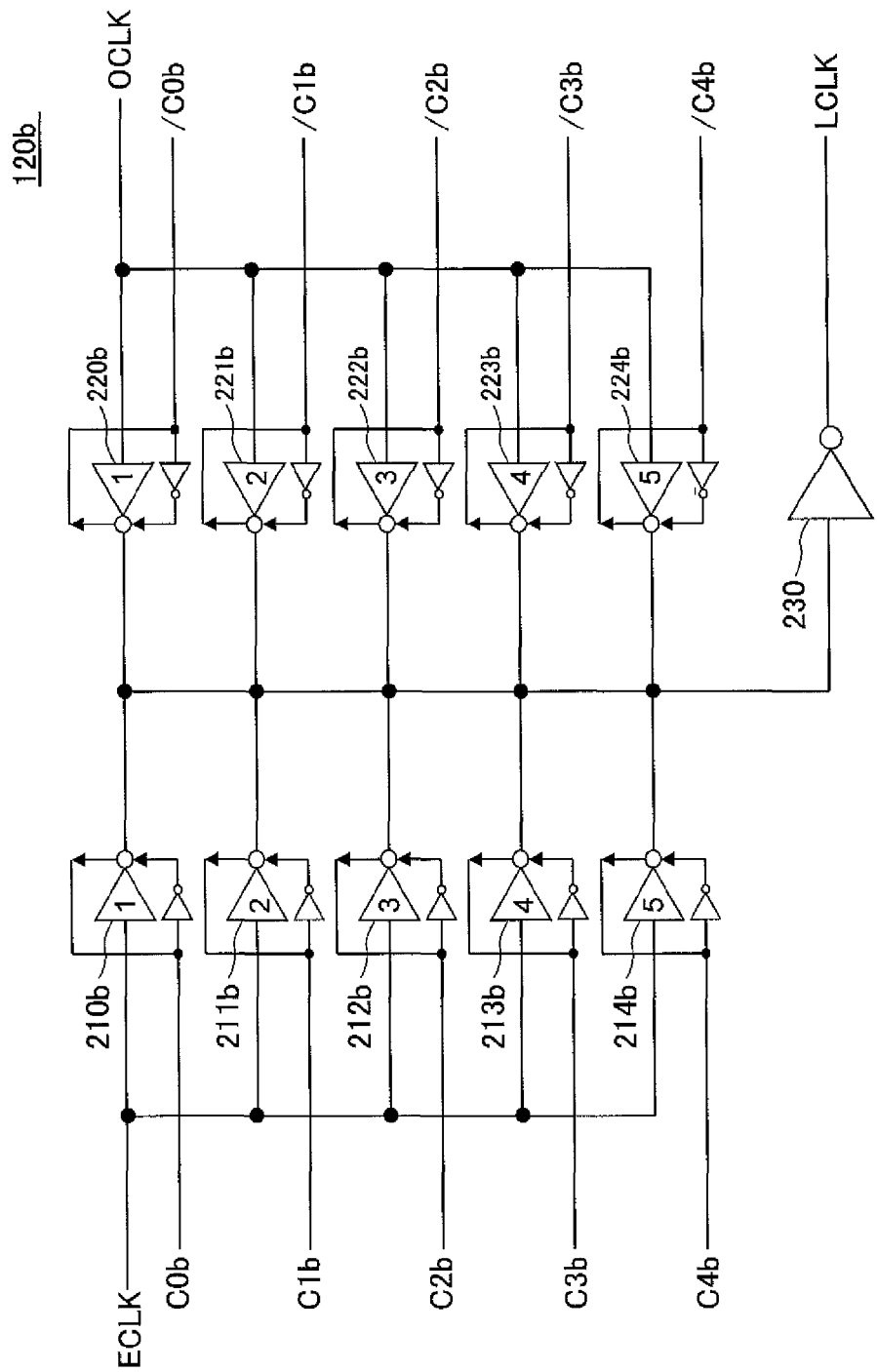
FIG. 9 is a circuit diagram of the fine adjusting unit according to a third embodiment of the present invention.

The fine adjusting unit 120b shown in FIG. 9 includes inverter circuits 210b to 214b that receive the internal clock signal ECLK and inverter circuits 220b to 224b that receive the internal clock signal OCLK. Relative drive capabilities of the inverter circuits 210b to 214b are set to "1", "2", "3", "4", and "5", respectively, and relative drive capabilities of the inverter circuits 220b to 224b are similarly set to "1", "2", "3", "4", and "5", respectively. In this example, the relative drive capabilities of the inverter circuits 214b and 224b having the highest drive capability are suppressed to "5" and the number of inverters that switch from ON to OFF or from OFF to ON is suppressed to two at the maximum. Therefore, the internal clock signal LCLK with fewer jitters than in the comparative example shown in FIG. 7 can be generated.

In this manner, it is not essential that the drive capabilities of the inverter circuits have a relation of being a power of 2, and the drive capabilities can be set to values not having the relation of being a power of 2 as in the third embodiment. According to the third embodiment, while the configuration of the decoding circuit 105 becomes slightly more complicated than that in the second embodiment, the occurrence of jitters becomes scarcer. The number of bits of adjustment codes C0b to C4b decoded is the same as that in the second embodiment.

A fourth embodiment of the present invention will be explained with reference to FIG. 10.

Figure 10:
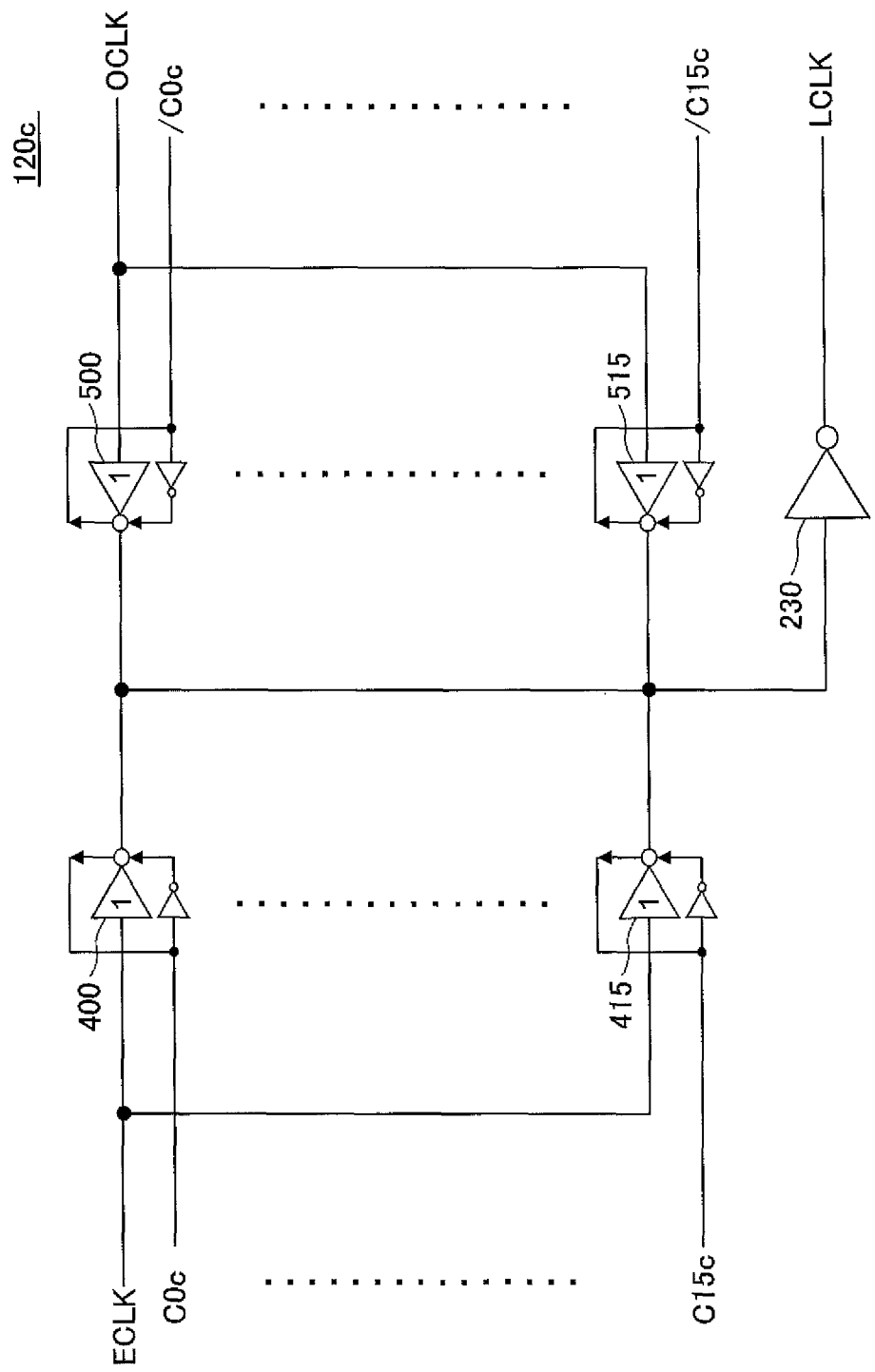
FIG. 10 is a circuit diagram of the fine adjusting unit according to a fourth embodiment of the present invention.

The fine adjusting unit 120c shown in FIG. 10 includes inverter circuits 400 to 415 that receive the internal clock signal ECLK and inverter circuits 500 to 515 that receive the internal clock signal OCLK. Drive capabilities of the inverter circuits 400 to 415 and 500 to 515 are all set to "1". In this example, while the circuit scale is somewhat increased because the number of bits of adjustment codes C0c to C15c decoded is 16, the drive capabilities of all the inverter circuits 400 to 415 and 500 to 515 are suppressed to "1" and the number of inverter circuits that switch from ON to OFF or from OFF to ON is suppressed to "1" at the maximum, so that the internal clock signal LCLK with so few jitters can be generated.

It is apparent that the present invention is not limited to the above embodiments, but may be modified and changed without departing from the scope and spirit of the invention.

For example, the configuration of the fine adjusting unit 120 is not limited to those in the embodiments described above and, when the phase of the internal clock signal is to be adjusted in $2^m+n$ steps (m is a natural number and n is a natural number equal to or smaller than $2^m$), it suffices that the smallest transistor has a size that enables to change the phase of the internal clock signal LCLK by one step and that the largest transistor has a size that enables to change the phase of the internal clock signal LCLK by smaller than $2^m$ steps. While the embodiments described above have explained examples in which m=3 and n=8, the present invention is not limited thereto.

The transistors all have a size that enables to change the phase of the internal clock signal LCLK by $2^{k-1}$ steps (k is an integer smaller than m) in the first embodiment, and the transistors all have a size that enables to change the phase of the internal clock signal LCLK by $2^k$ steps (k is an integer smaller than m) in the second embodiment. This means that the sizes of the transistors have a relation of being a power of 2, which simplifies the circuit configuration of the decoding circuit 105. In any of the above embodiments, the number of inverter circuits that receive the internal clock signal ECLK and the number of inverter circuits that receive the internal clock signal OCLK are m+2 or larger. This means that the sizes of the transistors are subdivided, so that occurrence of jitters can be suppressed.

In addition, while not specifically claimed in the claim section, the applicant reserves the right to include in the claim section of the application at any appropriate time the following semiconductor devices:

A1. A semiconductor device comprising:
a coarse adjusting unit generating first and second clock signals having different phases from each other; and
a fine adjusting unit generating a third clock signal having a phase between a phase of the first clock signal and a phase of the second clock signal, wherein
the fine adjusting unit includes a plurality of first transistors receiving the first clock signal and a plurality of second transistors receiving the second clock signal,
the fine adjusting unit controls the phase of the third clock signal in $2^{m+1}$ steps by synthesizing the first clock signal output from selected zero or more of the first transistors based on adjustment codes and the second clock signal output from selected zero or more of the second transistors based on the adjustment codes, where m is a natural number, and
a number of the first transistors is equal to or more than m+2, and a number of the second transistors is equal to or more than m+2.

A2. The semiconductor device as described in A1, wherein at least two of the first transistors have the same in size and at least two of the second transistors have the same in size.

A3. The semiconductor device as described in A1, wherein at least two or more of the first transistors have the largest in size, and at least two or more of the second transistors have the largest in size.

A4. The semiconductor device as described in A1, wherein all the first transistors have the same in size, and all the second transistors have the same in size.

What is claimed is:

1. A semiconductor device comprising:
a coarse adjusting circuit generating first and second clock signals having different phases from each other; and
a fine adjusting circuit generating a third clock signal having a phase between a phase of the first clock signal and a phase of the second clock signal, wherein
the fine adjusting circuit includes a plurality of first transistors receiving the first clock signal and a plurality of second transistors receiving the second clock signal,
the fine adjusting circuit controls the phase of the third clock signal in $2^m+n$ steps by synthesizing the first clock signal output from selected zero or more of the first transistors based on adjustment codes and the second clock signal output from selected zero or more of the second transistors based on the adjustment codes, where m is a natural number and n is a natural number equal to or smaller than $2^m$,
smallest one of the first transistors in size enables to change the phase of the third clock signal by one step, and largest one of the first transistors in size enables to change the phase of the third clock signal by smaller than $2^m$ steps, and
smallest one of the second transistors in size enables to change the phase of the third clock signal by one step, and largest one of the second transistors in size enables to change the phase of the third clock signal by smaller than $2^m$ steps.

2. The semiconductor device as claimed in claim 1, wherein at least two of the first transistors have the same in size and at least two of the second transistors have the same in size.

3. The semiconductor device as claimed in claim 2, wherein each of the first and second transistors enables to change the phase of the third clock signal by $2^k$ steps, where k is an integer smaller than m.

4. The semiconductor device as claimed in claim 3, wherein each of the first and second transistors enables to change the phase of the third clock signal by $2^{k-1}$ steps.

5. The semiconductor device as claimed in claim 1, wherein the fine adjusting circuit adjusts the phase of the third clock signal in $2^{m+1}$ steps.

6. The semiconductor device as claimed in claim 1, wherein a number of the first transistors is equal to or more than m+2, and a number of the second transistors is equal to or more than m+2.

7. The semiconductor device as claimed in claim 1, wherein at least two or more of the first transistors have the largest in size, and at least two or more of the second transistors have the largest in size.

8. The semiconductor device as claimed in claim 1, wherein all the first transistors have the same in size, and all the second transistors have the same in size.

9. A semiconductor device comprising:
a coarse adjusting circuit generating first and second clock signals having different phases from each other; and
a fine adjusting circuit generating a third clock signal having a phase between a phase of the first clock signal and a phase of the second clock signal, wherein
the fine adjusting circuit includes a plurality of first transistors receiving the first clock signal and a plurality of second transistors receiving the second clock signal,
the fine adjusting circuit controls the phase of the third clock signal in a plurality of steps by synthesizing the first clock signal output from selected zero or more of the first transistors based on adjustment codes and the second clock signal output from selected zero or more of the second transistors based on the adjustment codes, and
at least two of the first transistors have the same in size and at least two of the second transistors have the same in size.

10. The semiconductor device as claimed in claim 9, wherein at least two or more of the first transistors have the largest in size, and at least two or more of the second transistors have the largest in size.

11. The semiconductor device as claimed in claim 9, wherein all the first transistors have the same in size, and all the second transistors have the same in size.

12. A semiconductor device comprising:
a coarse adjusting circuit including a first input node, a first output node and a second output node, the first input node being configured to be supplied with a first clock signal, the first and second output nodes being configured to be respectively supplied with second and third clock signals of which phases are shifted from a phase of the first clock signal and different from each other; and
a fine adjusting circuit including a third output node, a plurality of first delay circuits of which input nodes are coupled in common to the first output node of the coarse adjusting circuit and output nodes are coupled in common to the third output node, and a plurality of second delay circuits of which input nodes are coupled in common to the second output node of the coarse adjusting circuit and output nodes are coupled in common to the third output node, at least two of the first delay circuits being substantially equal in phase shift amount to each other, and at least two of the second delay circuits being substantially equal in phase shift amount to each other.

13. The semiconductor device as claimed in claim 12, wherein the fine adjusting circuit is configured to merge clock signals outputted from the first and second delay circuits to generate a fourth clock signal at the third output node thereof.

14. The semiconductor device as claimed in claim 13, wherein each of the first delay circuits is configured to receive a corresponding one of the control signals and be activated in response to the corresponding one of the control signals and each of the second delay circuits is configured to receive a corresponding one of inverted control signals and be activated in response to the corresponding one of the inverted control signals.

15. The semiconductor device as claimed in claim 13, further comprising a data output circuit configured to output data to an outside of the semiconductor device in synchronism with the fourth clock signal.

16. The semiconductor device as claimed in claim 12, wherein the first delay circuits of the fine adjusting circuit comprise first inverter circuits, at least two of the first inverter circuits being substantially equal in size to each other, the second delay circuits of the fine adjusting circuit comprising second inverter circuits, at least two of the second inverter circuits being substantially equal in size to each other.

17. The semiconductor device as claimed in claim 16, wherein each of the first inverter circuits being substantially equal in size to a corresponding one of the second inverter circuits.

18. The semiconductor device as claimed in claim 12, further comprising a clock input terminal supplied with an external clock signal from an outside of the semiconductor device and a clock input circuit coupled between the clock input terminal and the coarse adjusting circuit to generate the first clock signal based on the external clock signal.

19. The semiconductor device as claimed in claim 12, wherein another of the first delay circuits is different in phase shift amount from the at least two of the first delay circuits and another of the second delay circuits is different in phase shift amount from the at least two of the second delay circuits.

20. The semiconductor device as claimed in claim 19, wherein the another of the first delay circuits is substantially equal in phase shift amount to the another of the second delay circuits.

* * * * *